(12) United States Patent  
Prasad

(10) Patent No.: US 6,209,014 B1  
(45) Date of Patent: Mar. 27, 2001

(54) LOOK-AHEAD LMS TECHNIQUE

(75) Inventor: Mohit Kishore Prasad, Northampton County, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/955,415

(22) Filed: Oct. 21, 1997

Related U.S. Application Data

(60) Provisional application No. 60/043,623, filed on Apr. 14, 1997.

(51) Int. Cl.$^7$ .................................................... G06F 17/10
(52) U.S. Cl. .................................................... 708/322
(58) Field of Search .................. 364/724.19, 724.2; 375/232; 708/322, 323, 300, 319

(56) References Cited

U.S. PATENT DOCUMENTS

| | | | |
|---|---|---|---|
| 5,216,629 | * | 6/1993 | Gurcan et al. .................. 364/724.19 |
| 5,327,459 | * | 7/1994 | Hara et al. ..................... 364/724.2 X |
| 5,414,732 | * | 5/1995 | Kaufman ....................... 364/724.19 X |
| 5,734,598 | * | 3/1998 | Abbott et al. ................... 364/724.19 |

OTHER PUBLICATIONS

Pipeline Interleaving and Parallelism in Recursive Digital Filter–Part I: Pipelining Using Scattered Look–Ahead and Decomposition, Author–Keshab K. Parhi and David G. Messerschmitt, 1989 IEEE Trans.

Pipeline Interleaving and Parallelism in Recursive Digital Filter–Part II:, Author–Keshab K. Parhi et al., 1989 IEEE Trans.

* cited by examiner

*Primary Examiner*—Chuong Dinh Ngo  
(74) *Attorney, Agent, or Firm*—Gibbons, Del Deo, Dolan, Griffinger & Vecchione

(57) ABSTRACT

An apparatus and a technique for adapting a plurality of tap weights in an adaptive filter where tap weights are adapted utilizing every other sample of a sequence of samples. The apparatus comprises a sampler circuit for sampling an input signal producing a sequence of samples; a tap weight processor for generating the plurality of tap weights coupled to the sampler circuit; wherein the plurality of tap weights are adapted utilizing every other sample of the sequence of samples.

25 Claims, 3 Drawing Sheets

LOOK-AHEAD LMS TECHNIQUE

CROSS REFERENCES TO RELATED APPLICATIONS

This application claims the benefit of U.S. Provisional Application Ser. No. 60/043,623, filed on Apr. 14, 1997.

FIELD OF THE INVENTION

This invention relates to a Finite Impulse Response filtering, and more particularly to an adaptive weighting coefficient Finite Impulse Response filtering.

BACKGROUND OF THE INVENTION

A variety of digital techniques provide means of integrating filters capable of meeting high quality filter specifications. The performance of these filters typically equals and in particular cases exceeds performance available with passive Resistor-Inductor-Capacitive (RLC) filters.

Some truly integrated filters are discrete time filters in which a continuous time signal is sampled with a fixed periodicity and the analog amplitudes of the signal at the sample are linearly manipulated and transformed or digitally coded and processed before transformation. Filters which process sampled data linearly are classified as either Infinite Impulse Response (IIR) recursive filters or Finite Impulse Response (FIR) nonrecursive filters, depending upon whether the filter does or does not use recursion in internal loops when processing the samples.

While microprocessors are particularly suited for applications where speed and data handling size are not critical, they are not particularly well suitable for many data intensive applications. For example, medical imaging systems, speech recognition systems, and radar systems require that very large amounts of data be processed in real time. To increase their processing speed, a number of the systems utilize digital signal processors (DSP), which are optimized to process the sampled data at high rates. The repetitive nature of the signals allow the architecture of the digital signal processor to be optimized.

Referring to FIG. 1, there is shown a FIR filter 10. The FIR filter 10 has a sampler 12 which samples the input signal $V_{in}(t)$ at a sampling frequency of $f_s=1/T$, where T is the sampling period. The output of the sampler 12 is coupled to M delay stages 14 in sequence. Each delay stage 14 delays the associated sample by the period T. The delayed sampled signal $V_k$ at each node k is coupled to a multiplier 16 where the signal is multiplied by the tap weighting coefficient h(k). The outputs of the multipliers 16 are coupled to a summer 18 which sums the products of the multiplication. The output of the summer 18 is coupled to provide the output of the filter $V_{out}(nT)$.

The FIR filter output $V_{out}(nT)$ is shown in Equation 1.

$$V_{out}(nT) = \sum_{k=1}^{M} h(k)V_k(nT) \quad \text{Equation 1.}$$

At t=nT the delay associated with node k is (k−1)T. Therefore, the signal at the node $V_k(nT)$ is shown in Equation 2 and the filter output is shown in Equation 3.

$$V_k(nT) = V_{IN}[nT-(k-1)T] \quad \text{Equation 2.}$$

$$V_{out}(nT) = \sum_{k=1}^{M} h(k)V_{IN}[nT-(k-1)T] \quad \text{Equation 3.}$$

This represents the linear convolution of the sequences h(k) and the sampled input signal. Where h(k) is the sequence of coefficients defining the impulse response of the filter, which is determined as the inverse Fourier transform of the desired filter response in the frequency domain, $V_{OUT}(nT)$ is the desired filter output in discrete time.

An adaptive FIR filter adapts the tap weighting coefficients h(k) of the multipliers 16 in response to the signal being processed. An adaptive Least Mean Square (LMS) algorithm consists of three steps: FIR filtering; prediction error computation; and filter coefficient update. In adaptive filtering by the LMS technique, the tap weighting coefficients h(k) are updated every sampling instant. In a programmable environment this poses a problem because of increased power consumption due to the large number of memory accesses. Some programmable systems may be able to reduce power by accessing two words at a time. This approach works only partially because most memory accesses are restricted to accessing double word at even address boundaries. Such as the words at the addresses 0, 2, 4, etc. In filtering applications this restriction is unacceptable if tap weights are to be updated every sample. If the tap weights are updated every second sample then it leads to errors and increased time to converge to the correct tap values. Furthermore, in even-aligned double-word memory fetch architectures, such as in a DSP having multiple Multiply Accumulate (MAC) units, the sample-by-sample LMS update algorithm tends to be cumbersome due to the memory misalignment of every odd sample.

Therefore, there is a need to update tap weights without discarding alternate input samples while only doing double word access from memory, which reduces computation time and power consumption without sacrificing performance.

SUMMARY OF THE INVENTION

In accordance with the present invention, an apparatus and a technique for adapting a plurality of tap weights in an adaptive filter is described. The plurality of tap weights are adapted utilizing every other time count using all samples of a sequence of samples. The apparatus comprises a sampler circuit for sampling an input signal producing a sequence of samples; a tap weight processor for generating the plurality of tap weights coupled to the sampler circuit; wherein the plurality of tap weights are adapted utilizing every other sample of the sequence of samples. A method in accordance with the present invention is also described.

DESCRIPTION OF THE DRAWINGS

The present invention is described in detail below in conjunction with the drawings, of which.

DETAILED DESCRIPTION OF VARIOUS ILLUSTRATIVE EMBODIMENTS

Figure 1:
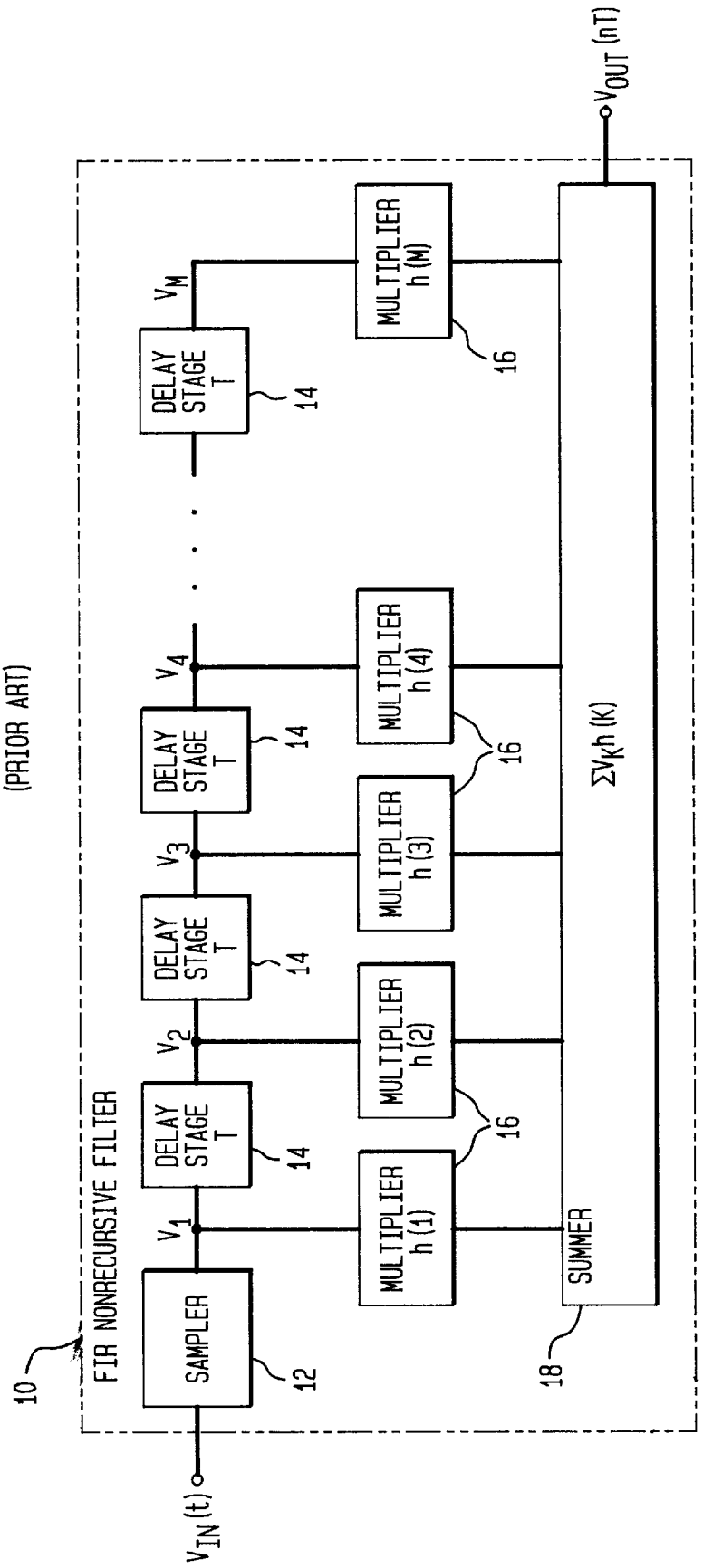
FIG. 1 shows a prior art FIR filter.
Figure 2:
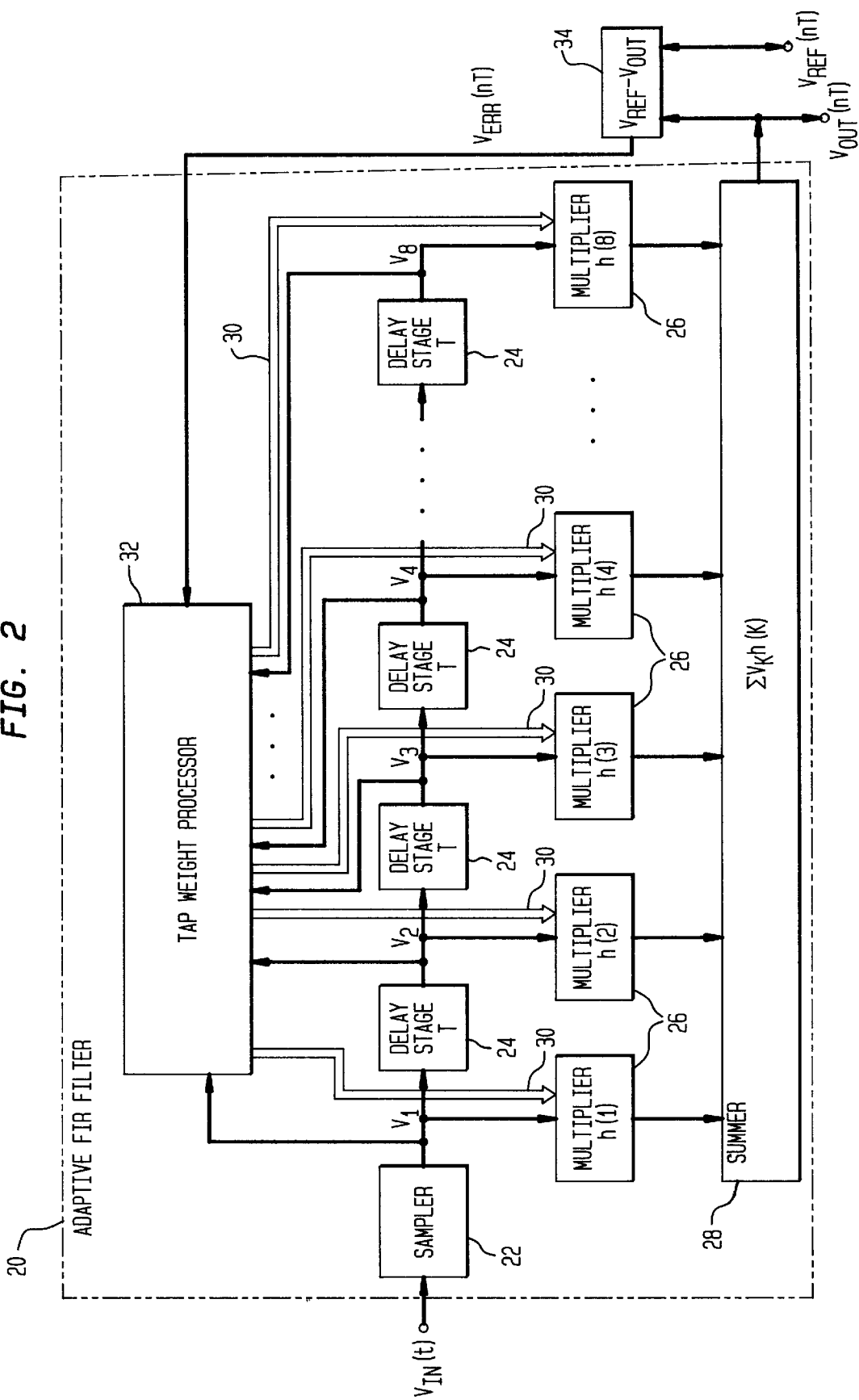
FIG. 2 shows an adaptive FIR filter of the present invention.

Referring to FIG. 2, there is shown an exemplary embodiment of an adaptive FIR filter 20 of the present invention for 8 tap weighting coefficients (N=8). The present invention is equally well suited for use with adaptive FIR filters having more than 8 tap weighting coefficients (N>8) as well as less than 8 tap weighting coefficients (N<8). The choice of N=8 is for simplicity of illustrating the present invention and is not a limitation. The adaptive FIR filter 20 has a sampler 22 which samples the input signal $V_{in}(t)$ at a sampling frequency of $f_s=1T$. The output of the sampler 22 is coupled to seven delay stages 24 in sequence. Each delay stage 24 delays the associated sample by the period T. The delayed sampled signal $V_k$ at each node k is coupled to a multiplier 26 where the signal is multiplied by the tap weighting coefficient h(k). The outputs of the multipliers 26 are coupled to a summer 28 which sums the products of the multiplication. The output of the summer 28 is coupled to provide the output of the FIR filter $V_{out}(nT)$. The tap weighting coefficients h(k) of the multipliers 26 are adapted in response to a tap weight line 30.

The output of the sampler 22 and the delayed sampled signal $V_k$ at each node k are coupled to a tap weight processor 32. The tap weight processor 32 (which can be timeshared) processes the indicated tap weight. The tap weight processor 32 has 8 output signal lines (N=8) each W bits wide. The output signal lines are coupled to each of the multipliers 26 of the adaptive FIR filter 20. Error detector 34 subtracts the output of the filter $V_{out}(nT)$ from a voltage reference $V_{ref}(nT)$ to provide an error signal $V_{err}(nT)$ which is coupled to the tap weight processor 32.

The LMS algorithm is characterized by the following equations:

$$y(n) = \sum_{k=0}^{N-1} h_n(k)x(n-k) \qquad \text{Equation 4a.}$$

$$e(n)=d(n)-y(n) \qquad \text{Equation 4b.}$$

$$h_{n+1}(k)=h_n(k)+\mu e(n) \times (n-k), k=0, 1, \ldots, N-1 \qquad \text{Equation 4c.}$$

where Equation 4a represents the filter output, Equation 4b represents the estimation error, and Equation 4c represents the tap-weight adaptation and x(n) is the input, y(n) is the estimated output, d(n) is the desired output, e(n) is the error, $h_n(k), k=0, 1, \ldots, N-1$ are the N taps of the FIR filter at time n, and $\mu$ is the adaptation step-size.

In programmable Digital Signal Processors (DSPs) with two Multiple-Accumulate (MACs) Units and even-aligned memory fetches the power of the processor is not fully utilized if the tap weights are updated with every sample. A better technique is to update the tap weights based on the previous two samples obtained instead of just the present sample. This technique, called look-ahead has been used extensively in dedicated hardware for IIR filters where speed constraints require pipelining. Interestingly, the even-aligned memory fetch is an identical constraint—the input buffer can be read every second cycle.

In a DSP having at least two MACs, it is desirable to obtain a new update of the taps, $h_{n+2}(k), k=0, 1, \ldots, N-1$, for every set of two samples x(n) and x(n+1). The LMS algorithm is characterized by its output which is represented by Equation 4a, by the error which is represented by Equation 4b, and by the coefficient updates which is represented by Equation 4c for $k=0, 1, \ldots, N-1$ and d(n) is the desired output. Equations 4a, 4b and 4c are rewritten and manipulated algebraically.

The coefficient updates at time n+1 are represented by $$h_{n+2}(k)=h_{n+1}(k)+\mu e(n+1) \times (n+1-k) \qquad \text{Equation 5a.}$$

and the error is represented by $$e(n+1)=d(n+1)-y(n+1) \qquad \text{Equation 5b.}$$

By substituting Equation 4c and 5b appropriately in Equation 5a the following relationship is obtained:

$$h_{n+2}(k)=h_n(k)+\mu e(n)\times(n-k)+\mu(d(n+1)-y(n+1))\times(n+1-k) \qquad \text{Equation 5c.}$$

At time n+1 the filter output is represented by $$y(n+1) = \sum_{k=0}^{N-1} h_{n+1}(k)x(n+1-k) \qquad \text{Equation 5d.}$$

By substituting Equation 5d into Equation 5c the following result is obtained:

$$h_{n+2}(k) = h_n(k) + \mu e(n)x(n-k) + \qquad \text{Equation 5e.}$$
$$\mu\left(d(n+1) - \sum_{k=0}^{N-1} h_{n+1}(k)x(n+1-k)\right)x(n+1-k)$$

Further by substituting Equation 4c into Equation 5e the following result is obtained:

$$h_{n+2}(k) = h_n(k) + \mu e(n)x(n-k) + \qquad \text{Equation 5f.}$$
$$\mu\left(d(n+1) - \sum_{k=0}^{N-1} h_n(k)x(n+1-k) - \right.$$
$$\left. \mu e(n)\sum_{k=0}^{N-1} x(n-k)x(n+1-k)\right)x(n+1-k)$$

Defining an intermediate output as $$y'(n+1) = \sum_{k=0}^{N-1} h_n(k)x(n+1-k) \qquad \text{Equation 5g.}$$

an intermediate error as $$e'(n+1)=d(n+1)-y'(n+1) \qquad \text{Equation 5h.}$$

and a correlate as $$\phi_1(n+1) = \sum_{k=0}^{N-1} x(n-k)x(n+1-k). \qquad \text{Equation 5i.}$$

yields $$h_{n+2}(k) = h_n(k) + \mu e(n)x(n-k) + \mu e(n+1)x(n+1-k), \qquad \text{Equation 5j.}$$
$$k = 0, 1, \ldots, N-1$$
$$= h_n(k) + \mu e(n)x(n-k) +$$
$$\mu(e'(n+1) - \mu e(n)\phi_1(n+1))x(n+1-k)$$

Using Equation 5i the following relationship can be written:

$$\phi_1(n-1) = \sum_{k=0}^{N-1} x(n-2-k)x(n-1-k) \quad \text{Equation 5k.}$$

such that $$\phi(n+1)=\phi_1(n-1)+x(n+1)\times(n)+x(n)\times(n-1)-x(n-N+1)\times(n-N)-x(n-N)\times(n-N-1) \quad \text{Equation 5l.}$$

Based on the derivation, the updates are then obtained only every other sample. Furthermore, no information is lost due to the correction from the correlation coefficient $\phi(n+1)$. As with equation 4b the error is still $e(n)=d(n)-y(n)$ and $e(n+1)=d(n+1)-y(n+1)$. The initial value of $\phi_1(\bullet)$ equals zero.

It can be seen that at the first stage of computation $y(n)$ and $y'(n+1)$ can be computed in parallel on the two MACs of the DSP using the tap coefficients $h_n(k)$, $k=0, 1, \ldots, N-1$. The computation of the errors $e(n)$ and $e'(n+1)$ follows. Then the correlation coefficient $\phi_1(n+1)$ is updated. It is important to note that the computation of $h_{n+2}(k)$ is independent from the computation of $h_{n+1}(k)$, $k=0, \ldots, N-1$. This method of adapting coefficients is referred to as the Look-Ahead LMS technique.

Figure 3:
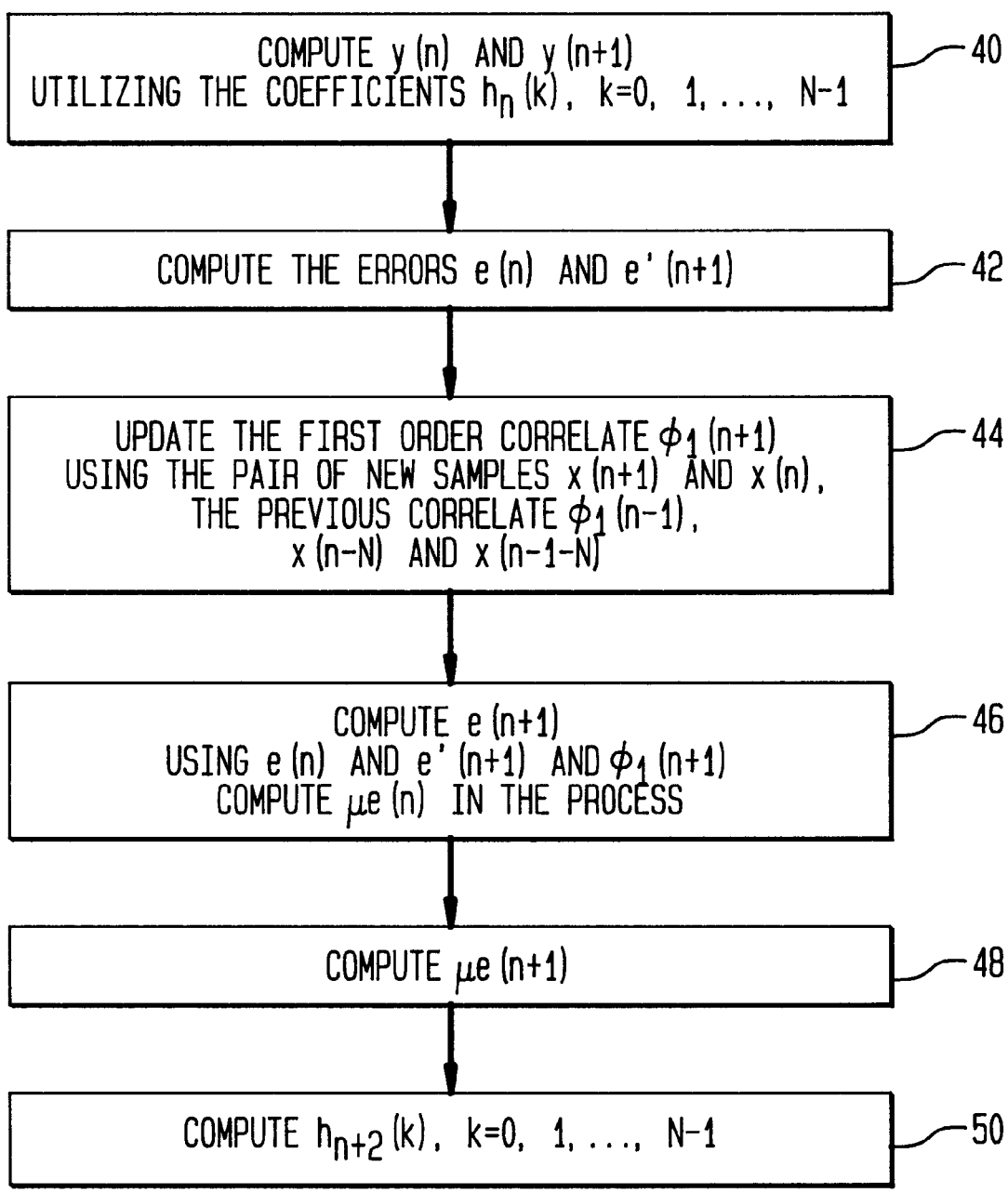
FIG. 3 shows a flow chart of the Look-Ahead LMS algorithm.

Referring to FIG. 3 there is shown a flow chart of the steps that are utilized for realizing the Look-Ahead LMS algorithm. In step 40 $y(n)$ and $y'(n+1)$ are generated utilizing the coefficients $h_n(k)$, $k=0, 1, \ldots, N-1$. In step 42 the errors $e(n)$ and $e'(n+1)$ are generated. The first order correlate $\phi_1(n+1)$ is updated using the pair of new samples $x(n+1)$ and $x(n)$, the previous correlate $\phi_1(n-1)$, $x(n-N)$, and $x(n-1-N)$ in step 44. In step 46 $e(n+1)$ are generated using $e(n)$ and $e'(n+1)$ and $\phi_1(n+1)$. Furthermore, $\mu e(n)$ is generated in the process in step 46. In step 48 $\mu e(n+1)$ is generated. In step 50 the tap weights $h_{n+2}(k)$, $k=0, 1, \ldots, N-1$ are generated.

This is an example of a particular algorithm and the application of the present invention. The present invention can be equally utilized with many other algorithms which can be rewritten utilizing the Look-Ahead LMS technique.

Signal processing algorithms have historically been structured for realization using sequential computational steps. Such a structure is useful for a high-level programming language realization. When these very same algorithms are ported for real-time application the sequential structure have been maintained. As the algorithms become more complicated, real-time and low-power constraints requires one to re-examine the algorithms to exploit inherent concurrencies. This approach has been disclosed for dedicated hardware in an article entitled "Pipeline Interleaving and Parallelism in Recursive Digital Filters—Parts I and II", by Keshab et al, in IEEE Trans. ASSP, vol. 37, no. 7, pp. 1099–1117 and pp. 1118–1134, July 1989, which is herein incorporated by reference. However such techniques have not been realized in a programmable environment. The architecture of such a programmable environment should realize a class, or multiple classes of algorithms.

Convolutions, correlations, matrix-computations, etc. can be realized with much lower power because of algorithm restructuring. The dual MAC provides a degree of parallelism which can be exploited when the algorithms are restructured to expose their concurrency. This feature is used in the Look-Ahead LMS algorithm above. The Look-Ahead LMS makes it unnecessary to have sample-by-sample updates. This leads to half as many updates resulting in lower power, both for memory access and computation, as well as faster updates.

An embodiment of an FIR filter in accordance with the present invention can be implemented on a single monolithic integrated circuit using techniques known to those skilled in the art.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

I claim:

1. A method of adapting tap weights in an adaptive filter, the method comprising the steps of:

generating a first filter output and a second filter output utilizing a first plurality of tap weights;

generating errors corresponding to said first filter output and said second filter output;

updating a first order correlate using a pair of new samples and a previous correlate;

generating an error using said errors corresponding to said first filter output and said second filter output and using said first order correlate; and generating a next plurality of tap weights.

2. The method as recited in claim 1 wherein said next plurality of tap weights are generated every other sample.

3. The method as recited in claim 1 wherein said first filter output is $y(n)$, said second filter output is $y'(n+1)$ and given tap weights $h_n(k)$, $k=0, 1, \ldots, N-1$ generating tap weights $h_{n+2}(k)$, $k=0, 1, \ldots, N-1$.

4. The method as recited in claim 1 wherein the error corresponding to said first filter output is $e(n)$ and an intermediate error for said second filter output is $e'(n+1)$.

5. The method as recited in claim 1 wherein said first order correlate is $\phi_1(n+1)$, said pair of new samples are $x(n+1)$ and $x(n)$, and said previous correlate is $\phi_1(n-1)$.

6. The method as recited in claim 1 wherein said error is $e(n+1)$ which is a function of $e(n)$, $e'(n+1)$ and $\phi_1(n+1)$.

7. The method as recited in claim 1 wherein the step of generating an error further comprises generating $\mu e(n)$, where $\mu$ is an adaptation step size.

8. The method as recited in claim 1 further comprising generating error changes, $\mu e(n+1)$, where $\mu$ is an adaptation step size.

9. The method as recited in claim 1 wherein said next plurality of tap weights is $h_{n+2}(k)$, $k=0, \ldots, N-1$.

10. The method as recited in claim 1 wherein a timeshared tap weight processor is using said first plurality of tap weights to produce said second plurality of tap weights.

11. A circuit for adapting tap weights of an adaptive filter in an integrated circuit comprising:

a tap weight processor for generating a plurality of tap weights in response to a sequence of digital samples, said tap weight processor comprising means for generating an error;

wherein said error is $e(n+1)$ which is a function of $e(n)$, $e'(n+1)$ and $\phi_1(n+1)$, where e is an error, e' is an intermediate error, $\phi_1$ is a correlation coefficient, n is a time, and said plurality of tap weights are adapted at every second sample.

12. The circuit as recited in claim 11 wherein said tap weight processor further comprises means for generating a first filter output and a second filter output utilizing the first plurality of tap weights;

wherein said first filter output is y(n), said second filter output is y'(n+1).

13. The circuit as recited in claim 11 wherein said tap weight processor further comprises means for generating errors corresponding to said first filter output and said second filter output;
wherein the error corresponding to said first filter output is e(n) and the error corresponding to said second filter output is e'(n+1).

14. The circuit as recited in claim 11 wherein said means for generating an error generates $\mu e(n)$, where $\mu$ is an adaptation step size.

15. The circuit as recited in claim 11 wherein said tap weight processor further comprises means for generating changes in errors, $\mu e(n+1)$, where $\mu$ is an adaptation step size.

16. The circuit as recited in claim 11 wherein said tap weight processor further comprises means for generating a next plurality of tap weights, said next plurality of tap weights is $h_{n+2}(k)$, k=0, 1, ..., N−1.

17. A circuit for adapting tap weights of an adaptive filter in an integrated circuit comprising:
a tap weight processor for generating a plurality of tap weights in response to a sequence of digital samples, said tap weight processor further comprising means for updating a first order correlate using a pair of new samples and a previous correlate;
wherein said first order correlate is $\phi_1(n+1)$, said pair of new samples are x(n+1) and x(n), and said previous correlate is $\phi_1(n-1)$.

18. An integrated circuit adaptive finite impulse response filter comprising:
a plurality of multiplier circuits having an input and an output wherein each of said plurality of multiplier circuits multiplies a signal applied to said input by a predetermined tap weight providing a weighted signal which is applied to said output;
a plurality of delay stages coupled in sequence such that each input of each of said plurality of multiplier circuits has one of said plurality of delay stages coupled between;
a summer circuit coupled to each of the outputs of each of said plurality of multiplier circuits wherein said summer circuit provides an output signal which is a summation of said weighted signals;
a tap weight processor coupled to each of said plurality of multiplier circuits for providing said predetermined tap weight, said tap weight processor comprising means for generating an error;
wherein said error is e(n+1) which is a function of e(n), e'(n+1) and ϕ1(n+1), where e is an error, e' is an intermediate error, $\phi_1$ is a correlation coefficient, n is a time, and tap weights are adapted utilizing every other sample of a sequence of samples.

19. The integrated circuit as recited in claim 18 wherein said tap weight processor further comprises means for generating a first filter output and a second filter output utilizing the first plurality of tap weights;
wherein said first filter output is y(n), said second filter output is y'(n+1) and comprises generating and said first plurality of tap weights is $h_n(k)$, k=0, 1, ..., N−1.

20. The integrated circuit as recited in claim 18 wherein said tap weight processor further comprises means for generating errors corresponding to said first filter output and said second filter output;
wherein the errors corresponding to said first filter output and said second filter output are e(n) and e'(n+1).

21. The integrated circuit as recited in claim 18 wherein said means for generating an error generates $\mu e(n)$, where $\mu$ is an adaptation step size.

22. The integrated circuit as recited in claim 18 wherein said tap weight processor further comprises means for generating changes in errors, $\mu e(n+1)$, where $\mu$ is an adaptation step size.

23. The integrated circuit as recited in claim 18 wherein said tap weight processor further comprises means for generating a next plurality of tap weights, said next plurality of tap weights is $h_{n+2}(k)$, k=0, 1, ..., N−1.

24. The integrated circuit as recited in claim 18 wherein said tap weight processor is a timeshared tap weight processor.

25. An integrated circuit adaptive finite impulse response filter comprising:
a plurality of multiplier circuits having an input and an output wherein each of said plurality of multiplier circuits multiplies a signal applied to said input by a predetermined tap weight providing a weighted signal which is applied to said output;
a plurality of delay stages coupled in sequence such that each input of each of said plurality of multiplier circuits has one of said plurality of delay stages coupled between;
a summer circuit coupled to each of the outputs of each of said plurality of multiplier circuits wherein said summer circuit provides an output signal which is a summation of said weighted signals;
a tap weight processor coupled to each of said plurality of multiplier circuits for providing said predetermined tap weight, said tap weight processor further comprising means for updating a first order correlate using a pair of new samples and a previous correlate;
wherein said first order correlate is $\phi_1(n+1)$, said pair of new samples are x(n+1) and x(n), and said previous correlate is $\phi_1(n-1)$.

* * * * *